United States Patent
Gong

(10) Patent No.: US 7,552,281 B2
(45) Date of Patent: Jun. 23, 2009

(54) APPARATUS AND METHOD FOR PROCESSING DATA IN A WIRELESS TERMINAL WITH EXTERNAL MEMORY

(75) Inventor: Sung-Hwa Gong, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 321 days.

(21) Appl. No.: 11/340,608

(22) Filed: Jan. 27, 2006

(65) Prior Publication Data

US 2006/0288167 A1 Dec. 21, 2006

(30) Foreign Application Priority Data

Jun. 17, 2005 (KR) ...................... 10-2005-0052430

(51) Int. Cl.
*G06F 12/00* (2006.01)
(52) U.S. Cl. ........................ 711/115; 711/156; 713/300
(58) Field of Classification Search ................ 711/115, 711/156; 714/22; 713/300
See application file for complete search history.

(56) References Cited

U.S. PATENT DOCUMENTS

| | | | |
|---|---|---|---|
| 4,587,640 A | 5/1986 | Saitoh ......................... | 365/229 |
| 5,016,223 A | 5/1991 | Kimura et al. .............. | 365/229 |
| 2002/0034302 A1* | 3/2002 | Moriai et al. ................ | 380/270 |
| 2002/0154243 A1* | 10/2002 | Fife et al. .................... | 348/372 |
| 2006/0245728 A1* | 11/2006 | Mukaihara et al. ........... | 386/96 |
| 2007/0206921 A1* | 9/2007 | Machida ...................... | 386/95 |

FOREIGN PATENT DOCUMENTS

| EP | 0 910 090 A2 | 4/1999 |
|---|---|---|
| KR | 1020010050945 | 6/2001 |
| WO | WO 9631076 | 10/1996 |

\* cited by examiner

*Primary Examiner*—Stephen C Elmore
*Assistant Examiner*—Mark A Giardino, Jr.
(74) *Attorney, Agent, or Firm*—Roylance, Abrams, Berdo & Goodman, L.L.P.

(57) ABSTRACT

An apparatus processes data using an external memory. In the apparatus, an external memory power supply provides power to the external memory. An external memory insertion detector detects insertion/removal of the external memory, and continues to detect an inserted state of the external memory when the power provided from the external memory power supply is cut off in the inserted state of the external memory. A first controller provides power to the external memory by controlling the external memory power supply, when the external memory is in use, and cuts off the power provided to the external memory by controlling the external memory power supply, when the external memory is not in use, generates a data list by detecting data from the external memory, and processes normal data in the data stored in the external memory. A second controller processes video data in the data stored in the external memory.

10 Claims, 4 Drawing Sheets

APPARATUS AND METHOD FOR PROCESSING DATA IN A WIRELESS TERMINAL WITH EXTERNAL MEMORY

PRIORITY

This application claims the benefit under 35 U.S.C. § 119 (a) of Korean Patent Application entitled "Apparatus and Method for Processing Data in a Wireless Terminal with External Memory" filed in the Korean Intellectual Property Office on Jun. 17, 2005 and assigned Ser. No. 2005-52430, the entire disclosure of which is hereby incorporated by reference.

BACKGROUND OF THE INVENTION

1. Field of the Invention

The present invention relates generally to an apparatus and method for processing data in a wireless terminal with an external memory. More particular, the present invention relates to an apparatus and method for processing data stored in an external memory without re-detecting insertion of the external memory when a right to control the external memory is changed, or when a voltage provided to the external memory of the wireless terminal is provided again after being cut off.

2. Description of the Related Art

Wireless terminals are evolving into complex terminals having various functions, such as a camera function and an MP3 player function. In the camera function, once resolution increases, the number of pixels per inch increases, making it difficult for a wireless terminal to control multiple functions together using an existing controller. Recently, wireless terminals have been designed to have a separate multimedia processor (or multimedia controller) for a camera module to perform video data-related control using the multimedia processor, and a controller for other data-related control.

Wireless terminals require a higher-capacity memory to meet the high-end requirements for the camera function. However, an extension of the memory capacity may cause many problems, such as in miniaturizing and manufacturing wireless terminals. To solve the above problems, a detachable external memory is provided to a wireless terminal so that the wireless terminal can support high-end functions that require the higher capacity memory.

In the course of generating a data list of a detachable external memory and processing the corresponding data, the wireless terminal, including a controller and a multimedia processor, must re-detect an insertion of the external memory. The wireless terminal also must regenerate a new data list, each time a right to control the external memory is changed from the controller to the multimedia processor and vice versa, or power provided to the external memory inserted into the wireless terminal is provided again after being cut off because of nonuse.

Accordingly, there is a need for an improved apparatus and method for processing data in an external memory of a wireless terminal.

SUMMARY OF THE INVENTION

An aspect of embodiments of the present invention is to address at least the above problems and/or disadvantages and to provide at least the advantages described below. Accordingly, an aspect of embodiments of the invention is to provide an apparatus and method for processing data stored in an external memory without re-detecting insertion of the external memory, when a right to control the external memory is changed, or when a voltage provided to the external memory inserted in the wireless terminal is provided again after being cut off.

It is another object of the present invention to provide an apparatus and method for processing data stored in an external memory without re-detecting insertion of the external memory, when a right to control the external memory is changed in a wireless terminal.

It is further another object of the present invention to provide an apparatus and method for processing data stored in an external memory without re-detecting insertion of the external memory when a voltage provided to the external memory inserted in the wireless terminal is provided again after being cut off.

According to one aspect of an exemplary embodiment of the present invention, there is provided an apparatus for processing data using an external memory. The apparatus includes an external memory power supply for providing power to the external memory. An external memory insertion detector detects insertion/removal of the external memory, and continuing to detect an inserted state of the external memory when the power provided from the external memory power supply is cut off in the inserted state of the external memory. A first controller provides power to the external memory by controlling the external memory power supply, when the external memory is in use, cuts off the power provided to the external memory by controlling the external memory power supply, when the external memory is not in use, generates a data list by detecting data from the external memory, and processes normal data in the data stored in the external memory. A second controller processes video data in the data stored in the external memory.

According to another aspect of an exemplary embodiment of the present invention, there is provided a method for processing data in a wireless terminal with an external memory. The method includes detecting the insertion of the external memory and providing power to the external memory, if the external memory is inserted. A data list is generated by detecting data from the external memory. An inserted state of the external memory is continuously detected, if particular data is selected from the data list, and a switch is switched to one of a first controller and a second controller, according to the selected data type. The selected data is processed.

According to a further aspect of an exemplary embodiment of the present invention, there is provided a method for processing data in a wireless terminal with an external memory. The method includes detecting the insertion of the external memory and providing power to the external memory, if the external memory is inserted. A data list is generated by detecting data from the external memory, and a switch is switched to one of a first controller and a second controller, according to the selected data type, if particular data is selected from the data list, and the selected data is processed. An inserted state of the external memory is continuously detected, if use of the external memory is stopped, and power provided to the external memory is cut off.

Other objects, advantages, and salient features of the invention will become apparent to those skilled in the art from the following detailed description, which taken in conjunction with the annexed drawings, discloses exemplary embodiments of the invention.

BRIEF DESCRIPTION OF THE DRAWINGS

The above and other objects, features and advantages of certain exemplary embodiments of the present invention will be more apparent from the following description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modifications of the embodiments described herein can be made without departing from the scope of the invention. Also, descriptions of well-known functions and constructions are omitted for clarity and conciseness.

In the following description, the term "data processing," as used herein, refers to an operation of playing back audio data, or displaying video or text data.

Figure 1:
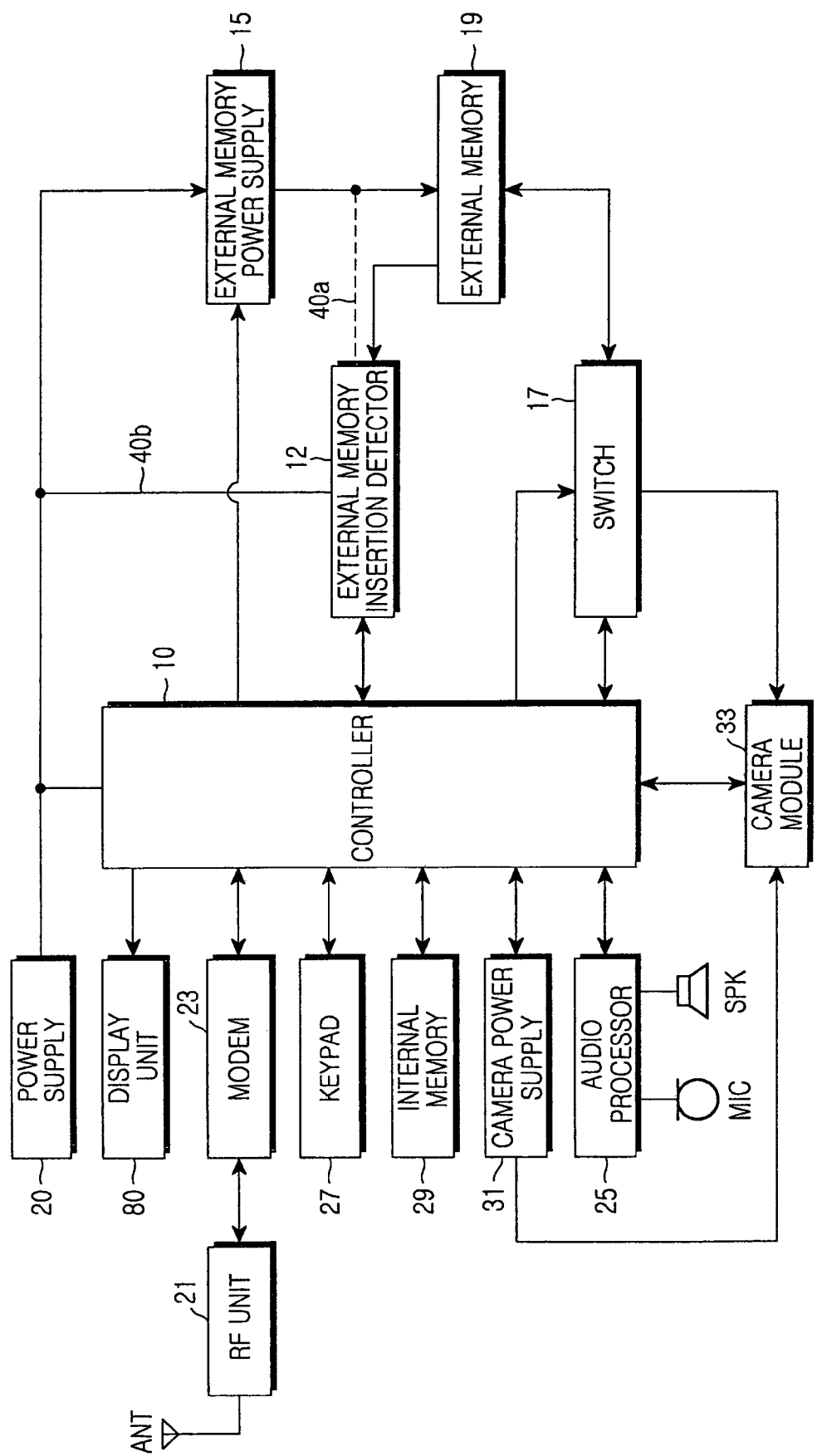
FIG. 1 is a block diagram illustrating a structure of a wireless terminal according to an exemplary embodiment of the present invention.

FIG. 1 is a block diagram illustrating a structure of a wireless terminal according to an exemplary embodiment of the present invention. Herein, the wireless terminal can include a mobile phone.

Referring to FIG. 1, a radio frequency (RF) unit 21 performs RF signal processing of the wireless terminal. The RF unit 21 includes an RF transmitter for frequency-up-converting a transmission signal and amplifying the frequency-up-converted transmission signal, and an RF receiver for low-noise-amplifying a received signal and frequency-down-converting the low-noise-amplified signal.

A modem 23 encodes and modulates the transmission signal, and demodulates and decodes the received signal.

An audio processor 25 can be comprised of a codec, which includes a data codec for processing packet data and an audio codec for processing audio signal. The audio processor 25 converts a digital audio signal received from the modem 23 into an analog audio signal using the audio codec, and plays back the analog audio signal through a speaker SPK. Further, the audio processor 25 converts an analog audio signal generated by a microphone MIC into a digital audio signal using the audio codec, and provides the digital audio signal to the modem 23.

A keypad 27 includes alphanumeric keys used for inputting numeric and text information, and function keys used for setting various functions.

An internal memory 29 can include a program memory and a data memory. The program memory stores programs for controlling a general operation of the wireless terminal, and stores programs required for processing data in an external memory 19 according to an exemplary embodiment of the present invention. The data memory temporarily stores data generated during execution of the programs, and stores a data list of the external memory 19 generated according to an exemplary embodiment of the present invention.

A camera module 33, including therein a camera, a signal processor, a video processor and a secondary controller (or multimedia processor), converts a video signal output from the camera into an image signal, and compresses/decompresses a received video signal accordingly, to meet standard requirements for a display unit 80. The camera module 33 processes the video data stored in the external memory 19 using the secondary controller according to an exemplary embodiment of the present invention.

A camera power supply 31 provides power to the camera module 33 according to a control signal from a primary controller 10 when the camera module 33 is in use.

A power supply 20 provides power for driving the wireless terminal when the wireless terminal is powered-on.

The external memory 19 can include a small-sized memory card used as a secondary storage for storing video data, audio data and text data. Generally, the memory card has 9 pins including Data Pin #0~#4, Ground Pin, VDD Pin, Command Pin, and Clock Pin. The number of the pins is subject to change according to a chip maker.

An external memory power supply 15 provides power to the external memory 19 according to a control signal from the primary controller 10 when the external memory 19 is in use.

An external memory insertion detector 12 detects insertion/removal of the external memory 19. The external memory insertion detector 12 continues to detect an inserted state of the external memory 19 when power provided from the external memory power supply 15 is cut off in the inserted state of the external memory 19. The conventional external memory insertion detector 12 is interconnected between the primary controller 10, a contact between the external memory power supply 15, and the external memory 19, as shown by reference numeral 40a. The insertion detector 12 must re-detect insertion of the external memory 19 and regenerate a new data list, each time a right to control the external memory 19 is changed from the primary controller 10 to the secondary controller, and vice versa, or power provided to the external memory 19 inserted in the wireless terminal is provided again after being cut off because of nonuse. However, the external memory insertion detector 12, according to an exemplary embodiment of the present invention, which is interconnected between the primary controller 10, a contact between the power supply 20, and the external memory power supply 15 as shown by reference numeral 40b, can continue to detect an inserted state of the external memory 19 even though the power provided to the external memory 19 is cut off. As a result, the problem of the conventional external memory insertion detector 12 is solved.

The primary controller 10 controls the overall operation of the wireless terminal. The primary controller 10 may include the modem 23. The primary controller 10 controls the external memory power supply 15 according to an exemplary embodiment of the present invention. Specifically, when the external memory 19 is in use, the primary controller 10 outputs a power supply signal to the external memory 19 and generates a data list by reading data from the external memory 19. When the external memory is not in use, the primary controller 10 outputs a power cutoff signal to the external memory 19 and processes normal data stored in the external memory 19. However, when power is provided again to the external memory 19, the primary controller 10 reads the previously generated data list from the internal memory 29, instead of regenerating a new data list. The primary controller 10 then provides a switching control signal to a switch 17, according to the data type selected from a displayed data list of the external memory 19.

The switch 17 is switched to the primary controller 10, when normal data in the external memory 19 is processed, and the secondary controller included in the camera module 33, when video data in the external memory 19 is processed.

The display unit 80 displays the generated data list of the external memory 19, normal data, and video data. The display unit 80 can be implemented with a liquid crystal display (LCD). In this case, the display unit 80 can include an LCD controller, a memory for storing video data, and an LCD element. If the LCD is implemented with a touch screen, the keypad 27 and the LCD may serve as an input unit.

An operation of the wireless terminal will now be described with reference to FIG. 1. If a user sets an origination mode after dialing with the keypad 27, the primary controller 10 processes the dialing information received through the modem 23, and converts the processed dialing information into an RF signal using the RF unit 21. Thereafter, if another party (or called party) generates a response signal, the primary controller 10 detects the response signal through the RF unit 21 and the modem 23. Upon detecting the response signal, the primary controller 10 forms a voice call path through the audio processor 25 for the user. In a termination mode, the primary controller 10 detects a setting of the termination mode through modem 23, and generates a ring signal through the audio processor 25. Thereafter, if the user responds to the ring signal, the primary controller 10 forms a voice call path through the audio processor 25 for the user. Although the voice communication is performed in the origination and termination modes by way of example, data communication for packet data and video data can also be performed in the origination and termination modes. In an idle mode or a text communication mode, the primary controller 10 displays text data processed by the memory 23 on the display unit 80.

A description will now provided of a data processing operation in a wireless terminal with an external memory according to an exemplary embodiment of the present invention. If a user inserts the external memory 19, the external memory insertion detector 12 provides an external memory insertion detect signal to the primary controller 10. Upon receiving the external memory insertion detect signal, the primary controller 10 provides power to the external memory 19 using the external memory power supply 15. In addition, the primary controller 10 generates a data list by detecting data from the external memory 19, and displays the generated data list on the display unit 80. If the user selects particular data in the displayed data list using the keypad 27, the primary controller 10 continues to detect the inserted state of the external memory 19 using the external memory insertion detector 12, switches the switch 17 to either the primary controller 10 or the secondary controller, according to the selected data type, and processes the selected data.

Figure 2:
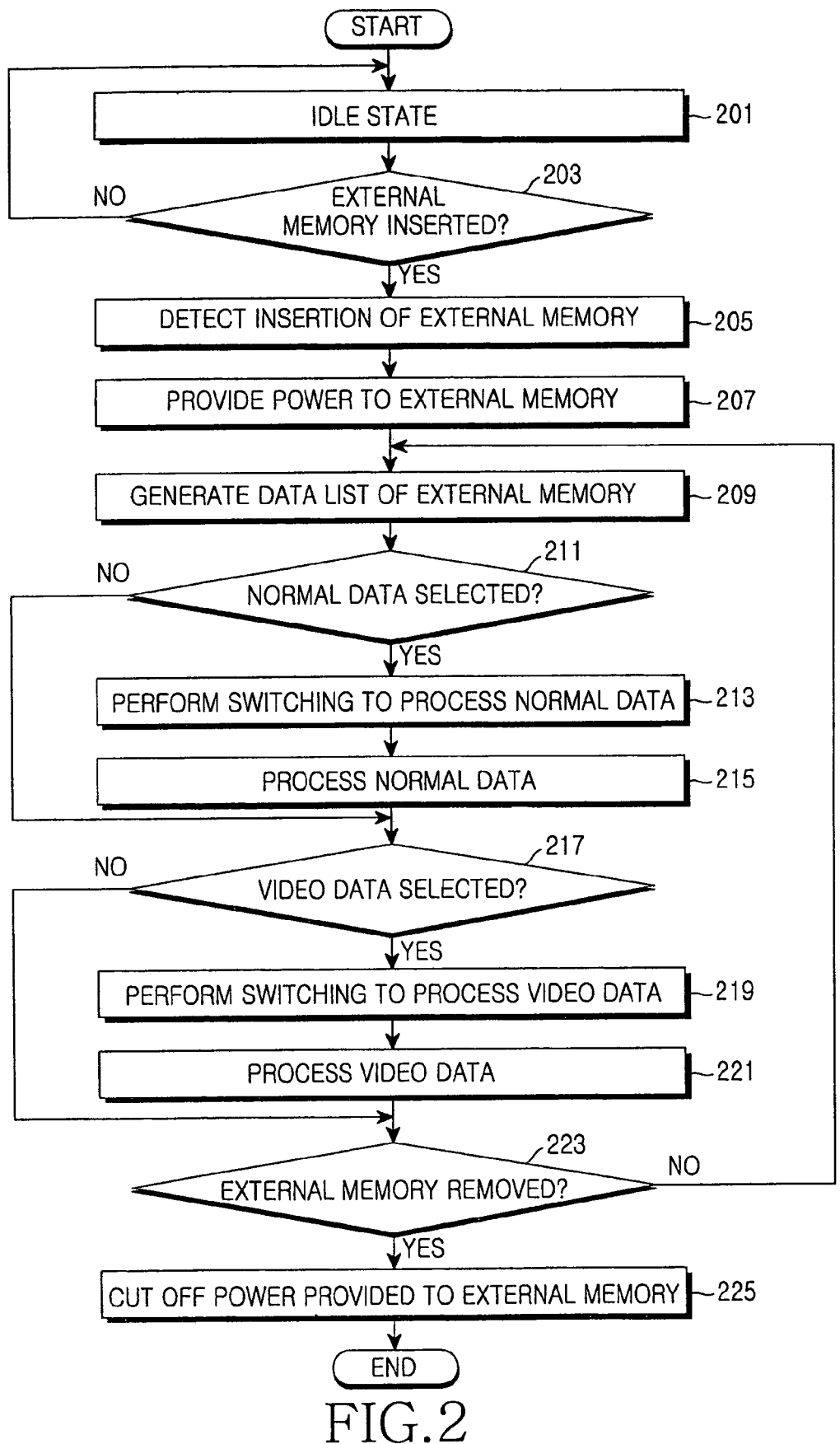
FIG. 2 is a flowchart illustrating a data processing operation in a wireless terminal with an external memory according to an exemplary embodiment of the present invention.

FIG. 2 is a flowchart illustrating a data processing operation in a wireless terminal with an external memory according to an exemplary embodiment of the present invention. With reference to FIG. 2, a description will now be made of an operation of processing data stored in an external memory without re-detecting insertion of the external memory, when a right to control the external memory is changed in a wireless terminal with an external memory.

Referring to FIG. 2, if a user inserts an external memory 19 in an idle state in step 201, an external memory insertion detector 12 provides an external memory insertion detect signal to a primary controller 10. Upon receiving the external memory insertion detect signal, the primary controller 10 detects the receipt of external memory insertion detect signal in step 203, and detects the insertion of the external memory 19 in step 205. The primary controller 10 provides necessary power to the external memory 19 by controlling an external memory power supply 15 in step 207. The primary controller 10 generates a data list by detecting data from the external memory 19 and displays the generated data list on a display unit 80 in step 209.

If the user selects normal data in the displayed data list using a keypad 27, the primary controller 10 detects the selection of the normal data in step 211, and continues to detect the inserted state of the external memory 19 using the external memory insertion detector 12. The primary controller 10 then switches a switch 17 in order to process the selected normal data, in step 213. That is, in the process of selecting the normal data, if the switch 17 was switched to the primary controller 10, the primary controller 10 maintains the switching state. However, if the switch 17 was switched to a secondary controller, the primary controller 10 switches the switch 17 thereto. The term "normal data," as used herein, refers to audio data (for example, MP3 data) and text data, other than the video data. The primary controller 10 processes the selected normal data in step 215. For example, if the selected data is audio data, the primary controller 10 plays back the audio data by controlling the audio processor 25. If the selected data is text data, the primary controller 10 displays the text data on the display unit 80.

However, if the user selects video data in the displayed data list using the keypad 27, the primary controller 10 detects the selection of the video data in step 217, and continues to detect the inserted state of the external memory 19 using the external memory insertion detector 12. The primary controller 10 then switches the switch 17 in order to process the selected video data, in step 219. In the process of selecting the video data, if the switch 17 was switched to the primary controller 10, the primary controller 10 switches the switch 17 to the secondary controller. However, if the switch 17 was switched to the secondary controller, the primary controller 10 maintains the switching state. The term "video data," as used herein, refers to image data and moving image data. The secondary controller processes the selected video data in step 221. For example, if the selected data is image data or moving image data, the secondary controller displays the image data or the moving image data on the display unit 80 by controlling a signal processor and a video processor included in a camera module 33.

Thereafter, if the user removes the external memory 19, the external memory insertion detector 12 provides an external memory removal detect signal to the primary controller 10. Upon receiving the external memory removal detect signal, the primary controller 10 detects the receipt of external memory removal detect signal in step 223, and cuts off the power provide to the external memory 19 by controlling the external memory power supply 15 in step 225.

Figure 3A:
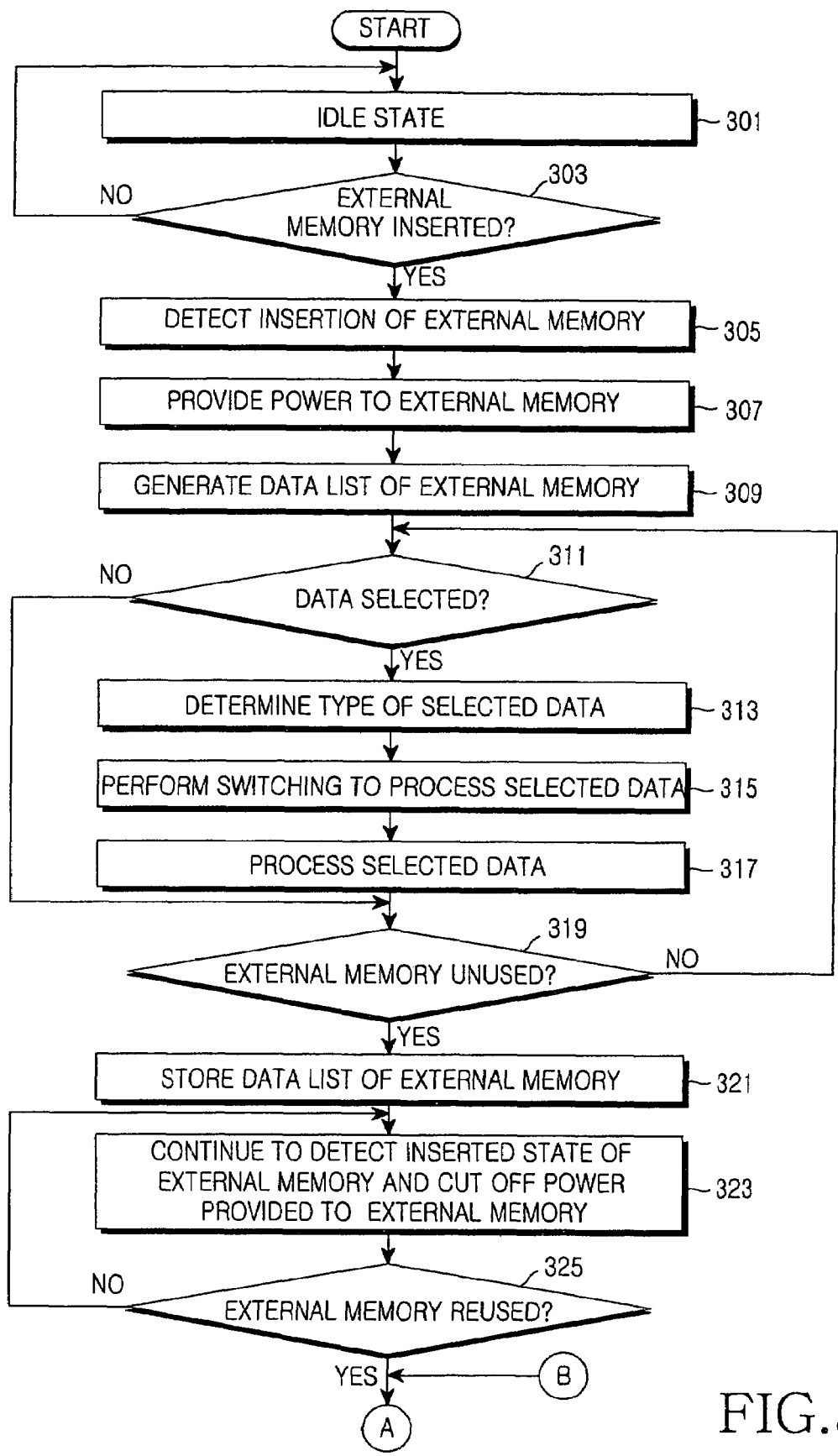
FIGS. 3A and 3B are diagrams illustrating a data processing operation in a wireless terminal with an external memory according to an exemplary embodiment of the present invention.
Figure 3B:
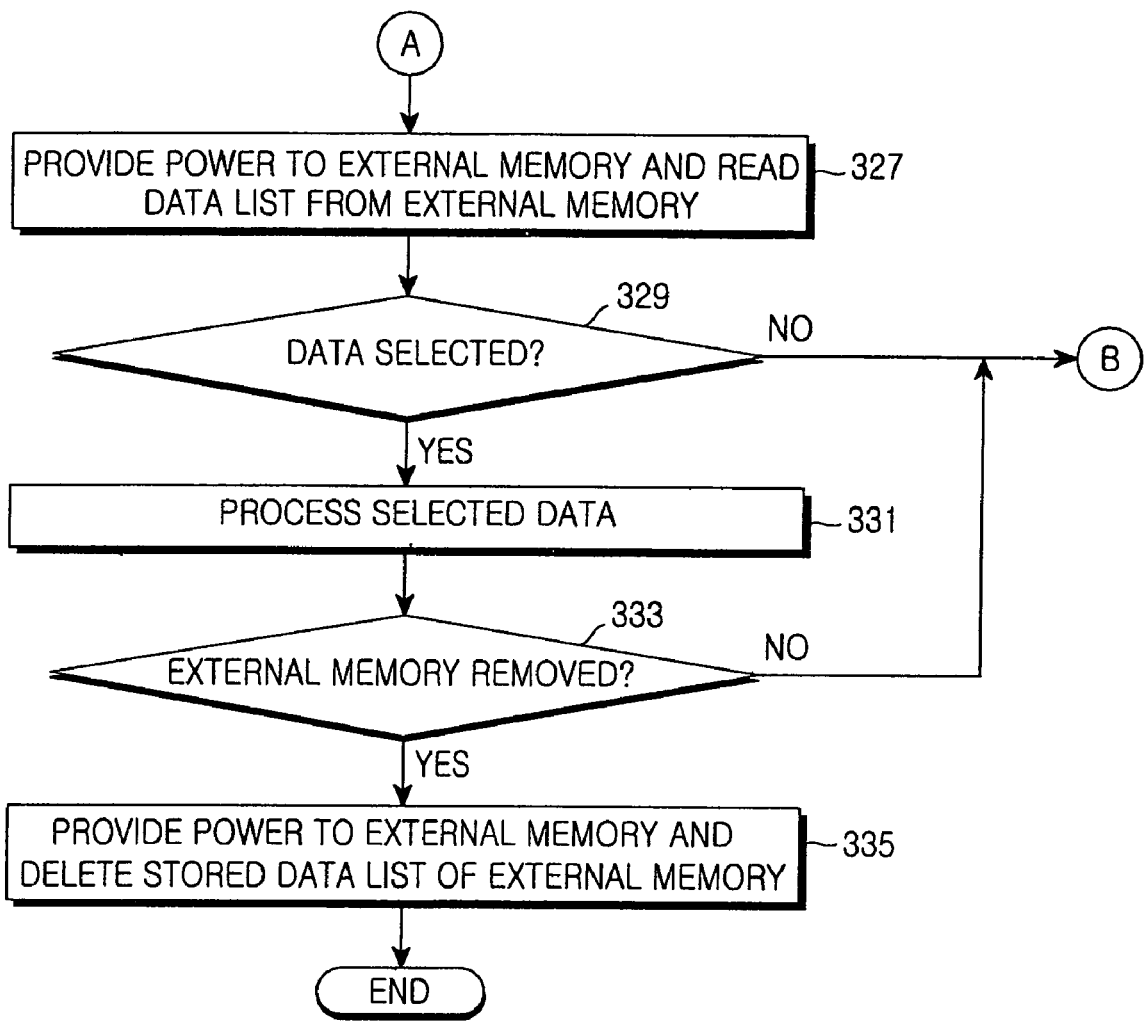

FIGS. 3A and 3B are diagrams illustrating a data processing operation in a wireless terminal with an external memory according to an exemplary embodiment of the present invention. With reference to FIGS. 3A and 3B, a description will now be made of an operation of processing data stored in an external memory without re-detecting insertion of the external memory, when a voltage provided to the external memory inserted in the wireless terminal is provided again after being cut off.

Referring to FIGS. 3A and 3B, if a user inserts an external memory 19 in an idle state in step 301, an external memory insertion detector 12 provides an external memory insertion detect signal to a primary controller 10. Upon receiving the external memory insertion detect signal, the primary controller 10 detects the receipt of external memory insertion detect signal in step 303, and detects the insertion of the external memory 19 in step 305. The primary controller 10 provides necessary power to the external memory 19 by controlling an external memory power supply 15 in step 307. The primary controller 10 generates a data list by detecting data from the external memory 19 and displays the generated data list on a display unit 80 in step 309.

If the user selects particular data in the displayed data list using a keypad 27, the primary controller 10 detects the selection of the particular data in step 311. The primary controller 10 determines the selected particular data type in step 313. In step 315, the primary controller 10 continues to detect the inserted state of the external memory 19 using the external memory insertion detector 12, and switches the switch 17 in order to process the selected particular data. That is, if the selected particular data is normal data, the primary controller 10 switches the switch 17 thereto, and if the selected data is video data, the primary controller 10 switches the switch 17 to a secondary controller. The primary controller 10 or the secondary controller processes the selected data according to the selected data type, in step 317. For example, if the selected data is audio data, the primary controller 10 plays back the audio data by controlling an audio processor 25. If the selected data is text data, the primary controller 10 displays the text data on the display unit 80. However, if the selected data is image data or moving image data, the secondary controller displays the image data or the moving image data on the display unit 80 by controlling a signal processor and a video processor included in a camera module 33.

Thereafter, if the user stops use of the external memory 19 using the keypad 27 and selects another function, the primary controller 10 detects the stop of use of the external memory 19 in step 319, and stores the generated data list of the external memory 19 in an internal memory 29 in step 321. In step 323, the primary controller 10 continues to detect the inserted state of the external memory 19 using the external memory insertion detector 12, and cuts off power provided from the external memory power supply 15 to the external memory 19.

Thereafter, if the user reuses the external memory 19 using the keypad 27, the primary controller 10 detects the reuse of the external memory 19 in step 325, and provides power to the external memory 19 again by controlling the external memory power supply 15. The primary controller 10 then reads the stored data list of the external memory 19 from the internal memory 29, in step 327. If the user selects particular data in the displayed data list using the keypad 27, the primary controller 10 detects the selection of the particular data in step 329, and processes the selected data in step 331. The selected data is processed in a method performed in steps 313 through 319.

Thereafter, if the user removes the external memory 19, the external memory insertion detector 12 provides an external memory removal detect signal to the primary controller 10. Upon receiving the external memory removal detect signal, the primary controller 10 detects the receipt of the external memory removal detect signal in step 333. The primary controller 10 then cuts off the power provided to the external memory 19 by controlling the external memory power supply 15, and deletes the data list of the external memory 19 from the internal memory 29, in step 335.

As described from the foregoing description, exemplary embodiments of the present invention provides a wireless terminal with an external memory designed such that an external memory insertion detector is interposed between a primary controller and an external memory power supply, thereby allowing the primary controller to continuously detect an inserted state of the external memory. Therefore, the primary controller can process data stored in the external memory without re-detecting an insertion of the external memory and regenerating a new data list, each time a right to control the external memory is changed, or when the power provided to the external memory inserted in the wireless terminal is provided again after being cut off. Accordingly, the power controller contributes to an increase in operation efficiency and a decrease in power consumption.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An apparatus for processing data using an external memory, the apparatus comprising:
    an external memory power supply for providing power to the external memory;
    an external memory insertion detector for detecting insertion/removal of the external memory, and continuing to detect an inserted state of the external memory when the power provided from the external memory power supply is terminated in the inserted state of the external memory;
    a first controller for, when the external memory is in use, providing power to the external memory by controlling the external memory power supply, and terminating the power provided to the external memory via the external memory power supply when the external memory is not in use, generating a data list by detecting data from the external memory, and processing normal data among the data stored in the external memory;
    a second controller for processing video data among the data stored in the external memory;
    a switch that is switched to the first controller in a process of processing the normal data stored in the external memory, and switched to the second controller in a process of processing the video data stored in the external memory; and
    an internal memory for storing a program required for using the external memory and storing the generated data list of the external memory,
    wherein the first controller reads a previously generated data list without regenerating a new data list when power is provided again to the external memory.

2. The apparatus of claim 1, further comprising:
    a display unit for displaying the generated data list of the external memory, text data in the normal data, and video data; and
    an audio processor for playing back audio data in the normal data.

3. The apparatus of claim 1, wherein the second controller is comprised in a camera module.

4. The apparatus of claim 1, wherein the data list of the external memory is deleted from the internal memory when the external memory is removed.

5. A method for processing data in a wireless terminal with an external memory, the method comprising the steps of:
    detecting the insertion of the external memory and providing power to the external memory, if the external memory is inserted;
    generating a data list by detecting data from the external memory, if particular data is selected from the data list, switching a switch to one of a first controller and a second controller, according to the selected data type, and processing the selected data; and continuing to detect an inserted state of the external memory, if use of the external memory is stopped, and terminating power provided to the external memory; and reading a previously generated data list without regenerating a new data list when power is provided again to the external memory.

6. The method of claim 5, wherein the particular data comprises normal data or video data.

7. The method of claim 6, wherein the normal data comprises audio data and text data.

8. The method of claim 5, wherein the switch is switched to the first controller, if the selected data is normal data.

9. The method of claim 5, wherein the switched is switched to the second controller, if the selected data is video data.

10. The apparatus of claim 1, wherein an external memory insertion detector is connected between the external memory power supply and the first controller.

* * * * *